US012683360B2

(12) United States Patent
Shindo et al.

(10) Patent No.: US 12,683,360 B2
(45) Date of Patent: Jul. 14, 2026

(54) SEMICONDUCTOR CHIP AND OPTICAL MODULE

(71) Applicant: NTT, Inc., Tokyo (JP)

(72) Inventors: Takahiko Shindo, Musashino (JP);
Meishin Chin, Musashino (JP);
Shigeru Kanazawa, Musashino (JP)

(73) Assignee: NTT, Inc., Tokyo (JP)

( * ) Notice: Subject to any disclaimer, the term of this patent is extended or adjusted under 35 U.S.C. 154(b) by 727 days.

(21) Appl. No.: 18/040,763

(22) PCT Filed: Aug. 20, 2020

(86) PCT No.: PCT/JP2020/031540
§ 371 (c)(1),
(2) Date: Feb. 6, 2023

(87) PCT Pub. No.: WO2022/038756
PCT Pub. Date: Feb. 24, 2022

(65) Prior Publication Data
US 2023/0283046 A1      Sep. 7, 2023

(51) Int. Cl.
H01S 5/026 (2006.01)
H01S 5/00 (2006.01)
(Continued)

(52) U.S. Cl.
CPC .......... H01S 5/1003 (2013.01); H01S 5/0071 (2013.01); H01S 5/0202 (2013.01);
(Continued)

(58) Field of Classification Search
CPC ...... H01S 5/0071; H01S 5/026; H01S 5/0265; H01S 5/101; H01S 5/1085
See application file for complete search history.

(56) References Cited

U.S. PATENT DOCUMENTS 4,901,123 A * 2/1990 Noguchi ............ G01M 11/3172
257/97
5,995,692 A * 11/1999 Hamakawa .......... G02B 6/4274
372/102
(Continued)

FOREIGN PATENT DOCUMENTS

EP          4535582 A1 *  4/2025    ............. H01S 5/164
JP     2001185805 A  *  7/2001
(Continued)

OTHER PUBLICATIONS

Wataru Kobayashi, et al., *Novel Approach for Chirp and Output Power Compensation Applied to a 40-Gbit/s EADFB Laser Integrated with a Short SOA*, Optics Express, vol. 23, No. 7, Apr. 6, 2015, pp. 9533-9542.

(Continued)

*Primary Examiner* — Tod T Van Roy
(74) *Attorney, Agent, or Firm* — Workman Nydegger

(57) ABSTRACT

Provided is a semiconductor chip that can reduce the man-hours for mounting on an optical module, a subcarrier, or the like, and reducing the dedicated area of the subcarrier or the like. The semiconductor chip includes a waveguide that is terminated inside at an output end portion from which light is emitted, without contacting an emission end face, and a window region made of a bulk semiconductor and disposed between the waveguide and the emission end face, wherein the semiconductor chip is provided with an open groove formed in the output end portion so that the emission end face is a side wall formed by etching.

8 Claims, 26 Drawing Sheets $\theta_f = \theta_2$ $\theta_{wg} = \theta_2 - \theta_1$

(51) Int. Cl.
  *H01S 5/02*          (2006.01)
  *H01S 5/10*          (2021.01)
  *H01S 5/12*          (2021.01)

(52) U.S. Cl.
  CPC ............ *H01S 5/026* (2013.01); *H01S 5/0265*
      (2013.01); *H01S 5/1085* (2013.01); *H01S 5/12*
                                              (2013.01)

(56)                References Cited

U.S. PATENT DOCUMENTS

| | | | | |
|---|---|---|---|---|
| 6,411,763 | B1 * | 6/2002 | Sillard ............... | G02B 6/12004 |
| | | | | 385/129 |
| 7,539,378 | B2 * | 5/2009 | Takabayashi ............. | H01S 5/12 |
| | | | | 385/39 |
| 8,457,168 | B2 * | 6/2013 | Kudo ...................... | H01S 5/026 |
| | | | | 372/50.1 |
| 9,152,055 | B2 * | 10/2015 | Nozaki ................. | G03F 7/2051 |
| 10,811,840 | B2 * | 10/2020 | Ariga ................. | H01S 5/02415 |
| 12,050,345 | B2 * | 7/2024 | Thomas ................. | G02B 6/327 |

| | | | | |
|---|---|---|---|---|
| 2004/0066806 | A1 * | 4/2004 | Deacon ................... | H01S 5/141 |
| | | | | 372/20 |
| 2010/0215072 | A1 * | 8/2010 | Funabashi ................ | G02B 6/42 |
| | | | | 257/E31.127 |
| 2023/0283046 | A1 * | 9/2023 | Shindo .................... | H01S 5/101 |
| | | | | 372/50.22 |
| 2024/0210623 | A1 * | 6/2024 | Shindo ................. | H01S 5/0265 |
| 2025/0323729 | A1 * | 10/2025 | Shindo ................. | H01S 5/1014 |

FOREIGN PATENT DOCUMENTS

| | | |
|---|---|---|
| JP | 2001-257421 A | 9/2001 |
| JP | 2009-246241 A | 10/2009 |
| JP | 5823920 B2 | 11/2015 |
| JP | 2016-018894 A | 2/2016 |
| JP | 2019-057539 A | 4/2019 |

OTHER PUBLICATIONS

Ken Morito, *High-Power Semiconductor Optical Amplifier*, Tutorial, OWQ4, OFC/NFOEC2009, Mar. 25, 2009, pp. 1-60.

* cited by examiner

Fig. 1

PRIOR ART

Fig. 2

PRIOR ART

PRIOR ART

Fig. 4

PRIOR ART

PRIOR ART

PRIOR ART

PRIOR ART

PRIOR ART $$\theta_f = \theta_2$$
$$\theta_{wg} = \theta_2 - \theta_1$$

SEMICONDUCTOR CHIP AND OPTICAL MODULE

TECHNICAL FIELD

The present invention relates to a semiconductor chip and an optical module, and more particularly to a semiconductor chip in which a semiconductor optical amplifier (SOA) is further integrated into a DFB laser in which an electric field absorption type (EA) modulator is integrated on an InP substrate, and an optical module including the semiconductor chip.

BACKGROUND ART

Network traffic has increased explosively with the recent spread of video distribution services and increase in mobile traffic demands. In an optical transmission line functioning as a network, it has been a trend to lower network costs through higher transmission rates, lower power consumption, and longer transmission distances. A semiconductor modulated light source used in such an optical communication network is also required to have a high speed and a high output while suppressing an excessive increase in power consumption.

Figure 1:
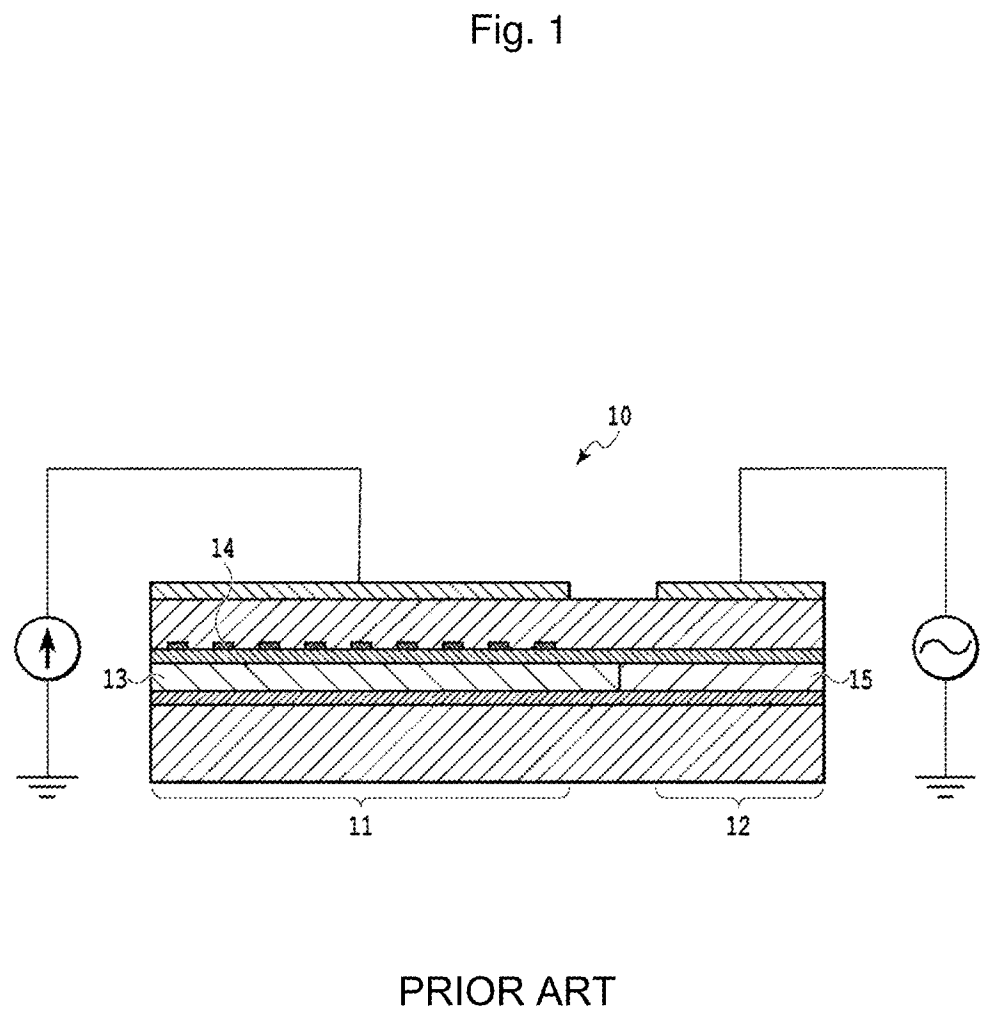

FIG. 1 shows a configuration of a conventional elect field absorption type modulator integrated DFB laser. The electric field absorption type modulator integrated DFB (EADFB: Electroabsorption Distributed Feedback) has been used in a wide range of applications since it has higher extinction characteristics and superior chirp characteristics as compared with a direct modulation type laser. A EADFB laser 10 has a structure in which a DFB laser 11 and an EA modulator 12 are integrated in the same chip. The DFB laser 11 includes an active layer 13 composed of a multiple quantum well (MQW), and oscillates at a single wavelength by a diffraction grating 14 formed in a resonator. The EA modulator 12 includes a light absorption layer 15 composed of a multiple quantum well (MQW) having a composition different from that of the DFB laser 11, and changes the light absorption amount by voltage control.

By driving the DFB laser 11 under a condition of transmitting and absorbing output light from the DFB laser 11, the light is flickered and an electric signal is converted into an optical signal. Examples of problems with the EADFB laser include a problem that the EA modulator 12 is accompanied by a large optical loss, making it difficult to achieve a high output. As a solution for this, for example, there is proposed an EADFB laser in which a semiconductor optical amplifier (SOA: Semiconductor Optical Amplifier) is further integrated at the light emission end of the EADFB laser (AXEL: SOA Assisted Extended Reach EADFB Laser) (see, for example, NPL 1).

Figure 2:
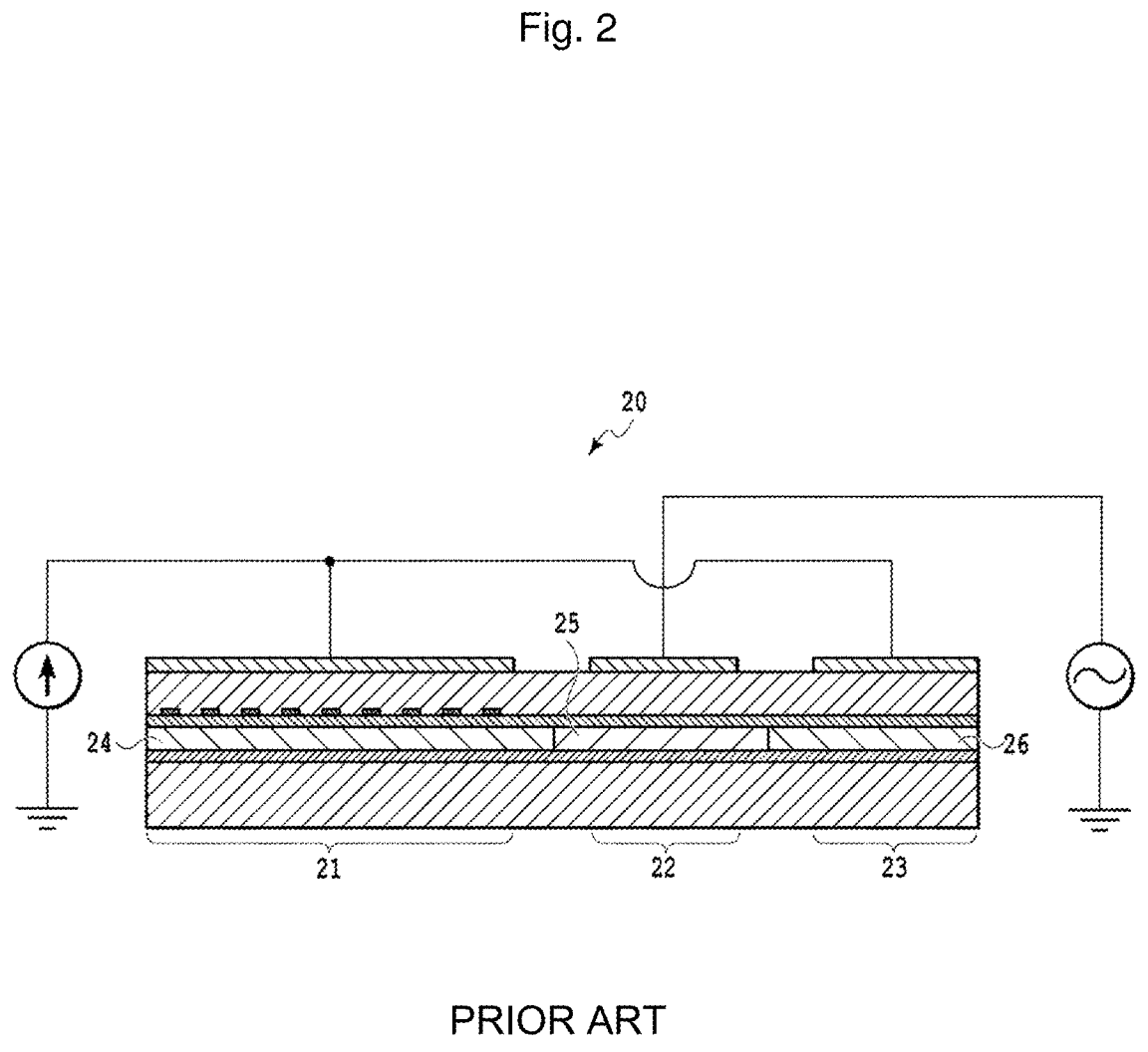

FIG. 2 shows a configuration of a conventional SOA integrated type EADFB laser. An AXEL 20 is provided with an SOA 23 after a DFB laser 21 and an EA modulator 22, and integrated in the same chip. The DFB laser 21 and the EA modulator 22 respectively include an active layer 24 and an absorption layer 25 composed of multiple quantum wells (MQW) having different compositions. In the AXEL 20, signal light modulated by the EA modulator 22 is amplified by the integrated SOA 23, and the optical output can be improved. Thus, output power characteristic that is approximately twice as high as that of a general EADFB laser can be obtained. In addition, since the AXEL 20 can operate with high efficiency by integrating the SOA, power consumption can be reduced by approximately 40% when driven under operating conditions in which the same optical output as that of a general EADFB laser can be obtained. Further, in the AXEL 20, an active layer 26 of the SOA 23 has the same MQW structure as the DFB laser 21. Therefore, a device can be produced in the same manufacturing process as that of a conventional EADFB laser without adding a regrowth process for integrating the SOA 23.

Examples of problems with the AXEL include a problem that the operating characteristics are significantly deteriorated due to the reflected return light due to a high output caused by the integration of the SOA. In an optical module using a general semiconductor laser, it is known that light is reflected on an end face of a semiconductor chip and reflected return light returning to the inside of the semiconductor chip brings about an adverse effect on the operation characteristics of an optical element. Therefore, in the conventional optical module, an anti-reflection coating (Anti-Reflection Coating) is applied to the end face of the semiconductor chip, and the reflected return light from the end face to the inside is suppressed to 0.1% or less.

However, in the case of the SOA integrated type EADFB laser, the high output characteristics greatly affect the operation characteristics even with slight reflected return light. If the optical amplification effect of the SOA integrated type EADFB laser is about +3 dB compared to the conventional EADFB laser, the average optical output is +3 dB high and the intensity of the reflected return light is also increased by 3 dB. In addition, since the reflected return light at the end face is amplified again in the SOA, the intensity of the reflected return light reaching the DFB laser is higher by +6 dB than that of the EADFB laser on which the SOA is not mounted.

FIG. 3 shows a structure of an output end portion in a conventional AXEL. As a countermeasure against reflected return light in the AXEL, a structure in which a window structure and a bent waveguide are combined is adopted in addition to the AR coating. FIG. 3 is an enlarged view of an output end portion of the AXEL, showing a structure of the waveguide viewed from the top. An emission end face 31 of an AXEL chip 30 is a crystal face formed by cleavage. In a general optical module, a waveguide in a semiconductor chip is formed at an angle perpendicular to an emission end face. Therefore, the light propagating through the waveguide enters the emission end face perpendicularly and exits from an A semiconductor chip. On the other hand, in the structure shown in FIG. 3, a waveguide 32 in the AXEL chip 30 is bent so that light enters the emission end face 31 at an incident angle of $\theta_{wg}$. Thus, since the light reflected on the emission end face 31 is hardly coupled to the waveguide 32 again, the reflected return light can be suppressed. Generally, the incident angle $\theta_{wg}$ of the waveguide 32 for suppressing reflection with respect to the emission end face 31 is 4 to 8°.

In the structure shown in FIG. 3, the waveguide 32 is terminated inside the AXEL chip 30, and after the light emitted from the waveguide 32 propagates through a bulk semiconductor called a window region 33, the light reaches the emission end face 31 and is emitted to the outside. At this time, in the window region 33, the beam diameter of the outgoing light propagates while expanding due to the diffraction effect. Thus, the ratio of the reflected return light reflected on the emission end face 31 and coupled again to the waveguide 32 in the chip can be further reduced. Generally, the length of the window region 33 is approximately 10 μm. In the AXEL, it is impossible to obtain high output characteristics and high quality transmission characteristics at the same time unless such a countermeasure against reflected return light is sufficiently taken.

As described above, in the conventional AXEL, a bent waveguide and a window structure are adopted at the output end portion in order to reduce the reflected return light at the chip end face as much as possible. Two major problems of this structure will now be described.

Figure 4:
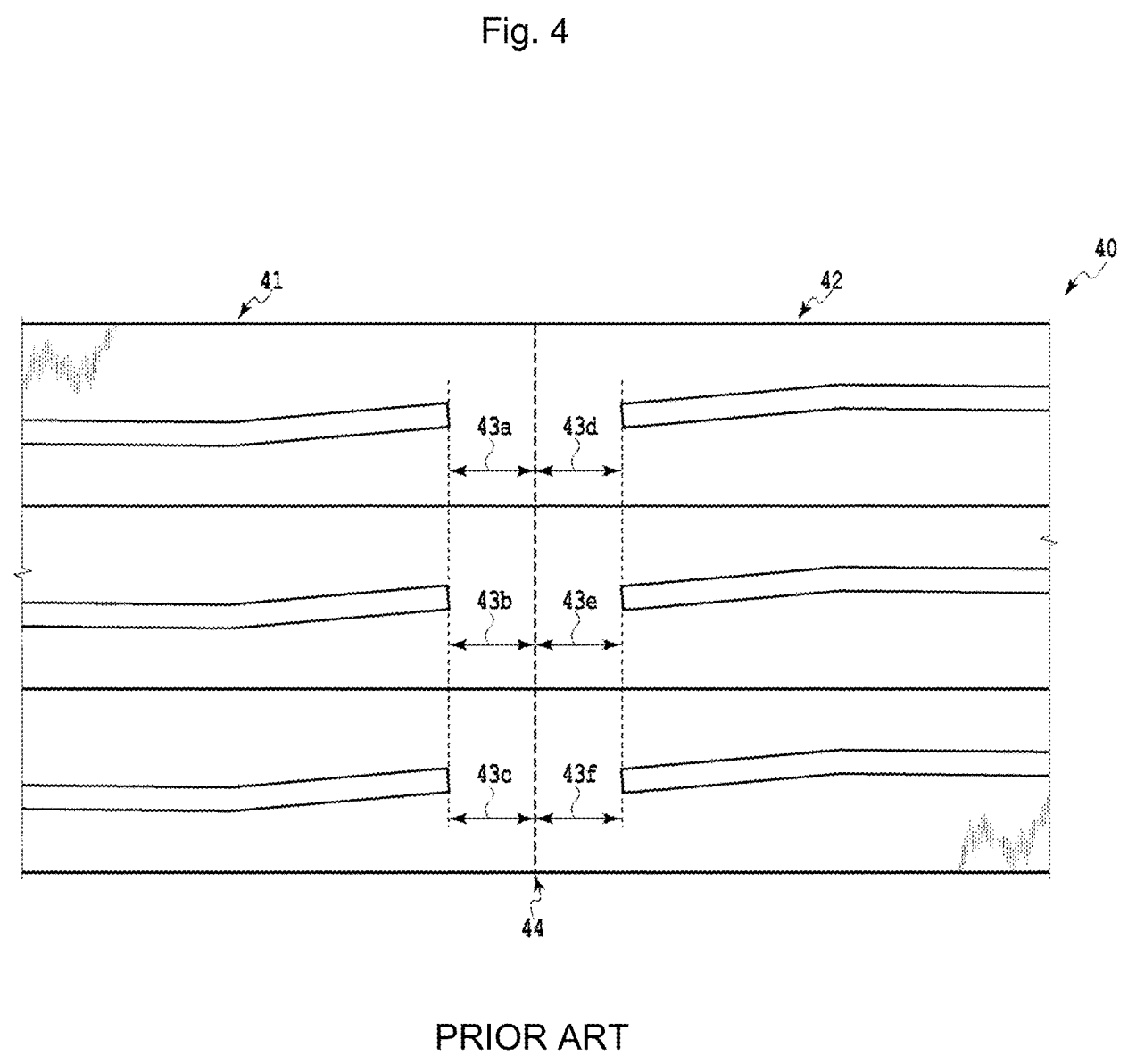

FIG. 4 is a schematic view of a case where a window structure formed at an output end portion is produced by cleavage. A first problem is a decrease in yield due to manufacturing variations when forming a window structure. Usually, an optical semiconductor device such as a semiconductor laser is divided into a plurality of semiconductor chips by growing a plurality of devices collectively on a wafer. In so doing, a plurality of chips having the same emission end face are cleaved at a cleavage position 44 as in bars 41 and 42, to form emission end faces. That is, the adjacent bars are arranged so that the emission end faces face each other.

As shown in FIG. 4, the semiconductor chips facing each other each have a window structure, and each have an end of a waveguide at the position separated from the cleavage position 44 by the length of the window region 43. Here, in the actual cleavage process of the semiconductor chip, there is a limit in the accuracy of the cleavage position, causing variation (error) in the cleavage position to some extent. Therefore, in a semiconductor chip having a window structure manufactured by cleavage, the length of window regions 43*a* to 43*f* varies depending on the chip due to variation in the cleavage position. As described above, the length of the window region is generally designed to be approximately 10 μm. Therefore, when an error of the cleavage position is 10 μm or more, all of the window regions of either one of the bars shown in FIG. 4 disappear, and a sufficient reflection suppressing effect cannot be obtained.

FIG. 5 shows the results of evaluation of the optical waveform quality of a plurality of conventional AXELs. This is a result of producing optical transmitters from AXEL chips produced in the same process, and evaluating the optical waveform quality. The AXEL chips have the same structure with the oscillation wavelength of 1.3 μm band, and the difference between the chips is only the length of the window region caused by the manufacturing error. For each of the AXEL chips, after the length of the window region was measured in advance, each chip was mounted on a general butterfly type package composed of a two-lens system, to produce optical transmitters. A high-frequency connector is mounted on the butterfly type package, and each of the produced optical transmitters is modulated by an NRZ signal of 25 Gbit/s, and an optical waveform (an eye aperture waveform) was evaluated.

The vertical axis in FIG. 5 is an index called a mask margin representing the quality of the optical waveform, and represents an aperture of the eye which is clearer as the margin gets larger. The horizontal axis in FIG. 5 shows variations in the length of the window region of each of the manufactured AXEL chips, with the length of 10 μm of the window region as a design value. As is apparent from FIG. 5, it can be confirmed that the mask margin tends to deteriorate as the length of the window region decreases. This is considered to be because the light intensity of the reflected return light which is reflected on the emission end face of the AXEL chip and returns to the inside of the chip increases as the length of the window region becomes shorter, and the operation of the AXEL chip becomes unstable. From the results shown in FIG. 5, it is understood that the length of the window region needs to be at least 5 μm or more.

FIG. 6 shows the shape of a light beam having a window structure formed at the output end portion. The structure of the waveguide 52 seen through the upper surface and the side surface of a semiconductor chip 50 is shown. The shape of a light beam 54 when a window region 53 becomes longer than the design due to the manufacturing error of the cleavage position is also shown. Usually, when a window structure is provided, the window structure is designed in consideration of the beam spread due to the diffraction effect of the light beam in the window region. In the case of a general InP-based optical semiconductor device, a cladding layer on the upper part of a waveguide is formed by regrowth, and the thickness H of the upper cladding layer is approximately 2 μm. In addition, in the case of a communication wavelength band of 1.55 μm or 1.3 μm band, the thickness d of the core layer is approximately 200 nm to 300 nm. In InP-based optical semiconductor devices, light confinement in the direction perpendicular to the waveguide is stronger than in the horizontal direction of the waveguide. Therefore, a light beam 54 emitted from the waveguide 52 to the window region 53 has a larger spread angle in the direction perpendicular to the waveguide at the emission end face 51 than in the horizontal direction of the waveguide.

Therefore, when the length of the window region 53 is longer than a designed value, the upper end of the light beam 54 reaches the interface between the cladding layer and the outside of the semiconductor chip (air and electrode) in the window region 53. As shown in the lower part of FIG. 6, this can cause defects in the beam shape (vignetting 54*a*) and optical loss.

FIG. 7 shows a relationship between the variation in the length of the window region of a plurality of conventional AXELs and optical loss. This is a result of plotting an optical loss with respect to the variation of the length of the window region caused by the manufacturing error at the time of cleavage, by using the plurality of AXEL chips shown in FIG. 5. As described above, the optical output characteristics were evaluated using a large-diameter photodetector prior to mounting the AXEL chips having the same structure on a butterfly type package. Thereafter, the optical fiber was mounted on the butterfly type package, and the intensity of light coupled to the optical fiber was evaluated to estimate the optical loss caused by the mounting. As described above, the optical transmitter used here has a two-lens system, and the AXEL chips were mounted by the active alignment process.

As is apparent from FIG. 7, it can be confirmed that the loss in the optical transmitter increases when the length of the window region increases. This is because as the length of the window region becomes longer, the upper end of the outgoing beam reaches the boundary between the cladding layer and the outside of the chips, resulting in a defective beam shape and reduced efficiency in coupling to the optical fiber. Here, in order to create an optical transmitter in which the optical loss in the optical transmitter is suppressed to 3.0 dB or less, the length of the window region of the AXEL chips needs to be 10 μm or less. However, in an actual cleavage process of a semiconductor chip, generally, a cleavage position error of approximately ±10 μm occurs. Therefore, as described above, when an optical transmitter having sufficient characteristics in the AXEL having a window structure is manufactured, a sufficient margin cannot be provided when forming the emission end face by cleavage. For this reason, a certain number of defective products, that is, chips in which the length of the window region deviates from the allowable value, are always generated due to the manufacturing error of the cleavage position, causing a decrease in the manufacturing yield.

FIG. 8 schematically shows a propagation direction of light at an emission end face of a semiconductor chip having a bent waveguide. The second problem is that when a bent waveguide is adopted, an emission angle is generated in the output light from the semiconductor chip, which becomes a limitation at the time of mounting. In FIG. 8, a bent waveguide 62 has an incident angle of $\theta_1$ on the emission end face. The emission angle of the light emitted from the semiconductor chip is defined as $\theta_2$. When an equivalent refractive index in the semiconductor chip is defined as $n_1$ and a refractive index of a medium outside the semiconductor chip is defined as $n_2$, the following expression is satisfied from Snell's law.

$$n_1 \sin \theta_1 = n_2 \sin \theta_2$$

When the equivalent refractive index of a general InP-based semiconductor chip is set to 3.2 and the medium on the emission side is air (refractive index n2=1), in a case where the incident angle $\theta_1$ with respect to the emission end face of the bent waveguide 62 is 5°, the emission angle $\theta_2$ becomes approximately 16°. When the incident angle $\theta_1$ is 7°, the emission angle $\theta_2$ is approximately 22°.

When mounting the semiconductor chip on an optical module or a subcarrier, the arrangement angle of the semiconductor chip needs to be adjusted in accordance with the emission angle from the semiconductor chip, to mount the semiconductor chip in such a manner that a sufficient optical output is coupled to an optical fiber or the like. In so doing, the larger the emission angle from the semiconductor chip, the larger the area required for mounting the chip inside the optical module or on the subcarrier. Thus, this has been an obstacle in improving the process during mounting and in miniaturizing the optical module and the subcarrier.

CITATION LIST

Patent Literature

[PTL 1] Japanese Patent No. 5823920

Non Patent Literature

[NPL 1] W Kobayashi et al., "Novel approach for chirp and output power compensation applied to a 40-Gbit/s EADFB laser integrated with a short SOA," Opt. Express, Vol. 23, No. 7, pp. 9533-9542, April 2015.
[NPL 2] K. Morito et al., "High power semiconductor optical amplifier," OFC/NFOECC2009, Tutorial, OWQ4, March, 2009.

SUMMARY OF INVENTION

An object of the present invention is to provide a semiconductor chip that can reduce the man-hours for mounting on an optical module, a subcarrier, or the like, and reducing the occupied area of the subcarrier or the like.

In order to achieve such an object, one embodiment of the present invention is a semiconductor chip including a waveguide terminated inside at an output end portion from which light is emitted, without contacting an emission end face, and a window region made of a bulk semiconductor and disposed between the waveguide and the emission end face, the semiconductor chip further including an open groove formed in the output end portion wherein the emission end face is a side wall formed by etching.

BRIEF DESCRIPTION OF DRAWINGS

FIG. 1 is a cross-sectional view showing a configuration of a conventional electric field absorption type modulator integrated DFB laser.

FIG. 2 is a cross-sectional view showing a configuration of a conventional SOA integrated EADFB laser.

FIG. 4 is a schematic diagram showing a case where a window structure formed at an output end portion is produced by cleavage.

DESCRIPTION OF EMBODIMENTS

Embodiments of the present invention will be described hereinafter in detail with reference to the drawings. Hereinafter, an optical transmitter on which an AXEL chip is mounted will be mainly described as an example, but the present embodiment is applicable to various optical modules mounted with semiconductor chips comprising optical semiconductor devices that emit light, and is not intended to limit parameters such as individual components, structures thereof, and oscillation wavelengths.

As described above, in the cleavage process of a semiconductor chip, a cleavage position error of approximately ±10 μm occurs. On the other hand, since the length of the window region required for securing AXEL characteristics is in the range of 5 μm to 15 μm, it has been difficult to manufacture AXEL chips in a stable manner at a high yield. Therefore, in the present embodiment, an emission end face of an AXEL chip is formed not by cleavage but by a dry etching process. Since the position of the emission end face can be aligned with high accuracy by a photolithography process, the emission end face can be generally formed with a positioning accuracy of ±1 μm or less. Also, in the dry etching process for forming the emission end face, by forming an open groove having a sufficient length in order to compensate for manufacturing errors of the cleavage position, a margin can be secured even for a general cleavage process.

Figure 9A:
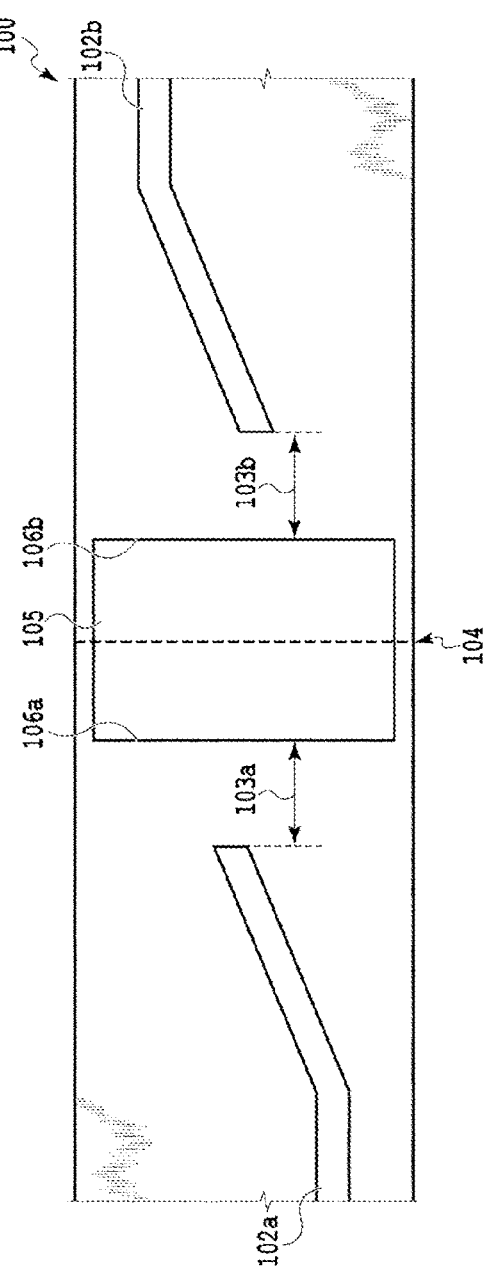
FIG. 9A is a diagram showing a structure of an output end portion according to an embodiment of the present invention.
Figure 9B:
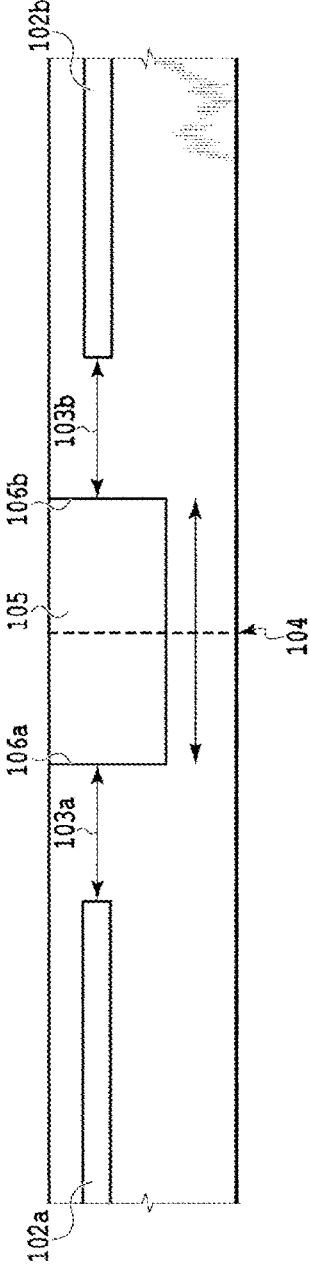
FIG. 9B is a diagram showing the structure of the output end portion according to an embodiment of the present invention.

FIGS. 9A and 9B show a structure of an output end portion according to one embodiment of the present invention. FIG. 9 is a schematic view showing a case where a window structure formed in the output end portion is produced by cleavage, wherein FIG. 9A shows a structure of a waveguide 102 seen from an upper surface of a semiconductor chip 100, and FIG. 9B shows a structure of the waveguide 102 seen from a side surface of the semiconductor chip 100. The semiconductor chip 100 includes the waveguide 102 terminated inside without coming into contact with an emission end face at an output end portion for emitting light, and a window region 103 made of a bulk semiconductor and disposed between the waveguide and the emission end face. An open groove 105 formed by dry etching is provided so as to extend over a boundary region of semiconductor chips facing each other across window regions 103a and 103b, that is, a cleavage plane 104. Side walls formed by etching (etched facets) both ends of the open groove 105 become emission end faces 106a, and 106b, and output light from the chips is emitted through these faces.

The size and position of an opening region for forming the etched facet are determined by a photolithography mask. Therefore, open grooves 105 of any shape can be formed collectively on a wafer, with a misalignment error of ±1μ or less. As can be seen from FIGS. 9A and 9B, the margin of the cleavage position is determined based on the size of the open grooves. Therefore, if the width of the open groove 105 is designed to be sufficiently wide, a sufficient margin can be secured even with respect to the misalignment of the cleavage position caused in a general cleavage process.

Figure 10:
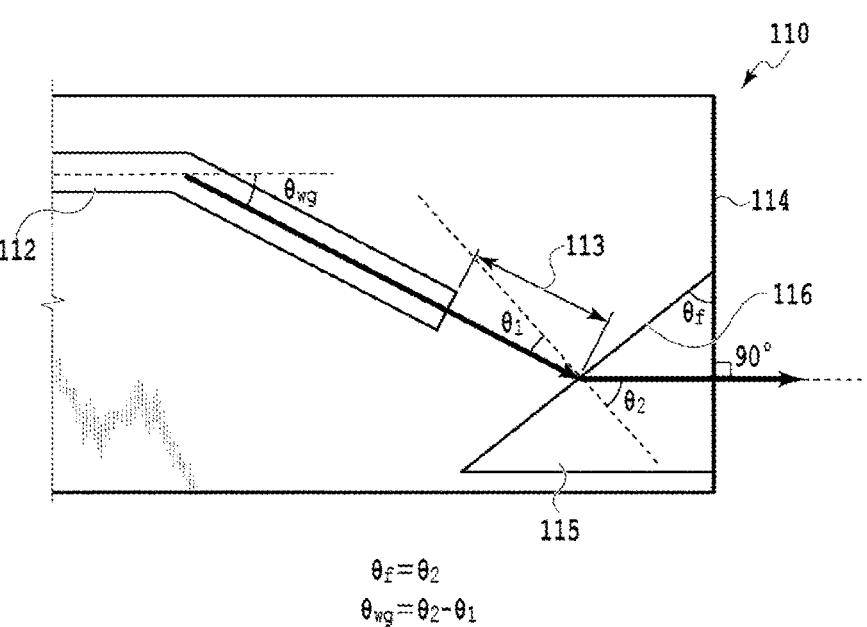
FIG. 10 is a diagram showing a structure of an open groove of the output end portion according to the present embodiment.

FIG. 10 shows a structure of the open groove at the output end portion according to the present embodiment. A problem of the emission angle of output light from the semiconductor chip accompanying a bent waveguide can be solved by the shape of an opening that forms the etched facet. In the output end portion shown in FIG. 9A, emission end faces 106a and 106b are parallel to the cleavage plane 104, whereas in the output end portion shown in FIG. 10, an emission end face 116 is formed at an angle inclined by an angle $\theta_f$ with respect to a cleavage plane 114. As described above, since the shape of an opening 115 is determined by a mask pattern of photolithography, an arbitrary shape can be produced.

In FIG. 10, the cleavage plane 114 corresponds to an emission end face of a conventional InP-based optical semiconductor device, and is formed when cleavage is performed in a bar shape. The light propagating through the waveguide propagates through a bent waveguide 112 at an angle of $\theta_{wg}$ with respect to a perpendicular line of the cleavage plane 114, and reaches the end of the waveguide. The light emitted from the end of the waveguide propagates through a window region 113 and then reaches the etched facet which is the emission end face 116. At this moment, the incident angle of light to the etched facet is defined as $\theta_1$, where $\theta_1$ is designed to an angle at which a sufficient reflection suppressing effect can be obtained. The light reaching the etched facet is refracted and emitted into the open groove 115 at an emission angle $\theta_2$.

At this moment, the traveling direction of the emitted light is designed to be perpendicular to the cleavage plane 114. Therefore, when viewed from the outside of the semiconductor chip, the emission angle is 0°, and the semiconductor chip can be considered as a semiconductor chip that vertically outputs light from the emission end face. As a result, the load on the mounting process can be reduced, and the area occupied by the semiconductor chip during mounting can be reduced. In order to adjust the outgoing light from the semiconductor chip in a direction perpendicular to the cleavage plane 114, each of the angles shown in FIG. 10 need to satisfy the following conditions.

$$\theta_{wg} = \theta_2 - \theta_1$$

$$\theta_f = \theta_2$$

Here, the relationship between $\theta_1$ and $\theta_2$ is derived from the Snell's law. Therefore, by designing the incident angle $\theta_1$ capable of sufficiently suppressing the end face reflection, the bending angle $\theta_{wg}$ of the waveguide and the angle $\theta_f$ of the etched facet are uniquely determined.

Figure 11:
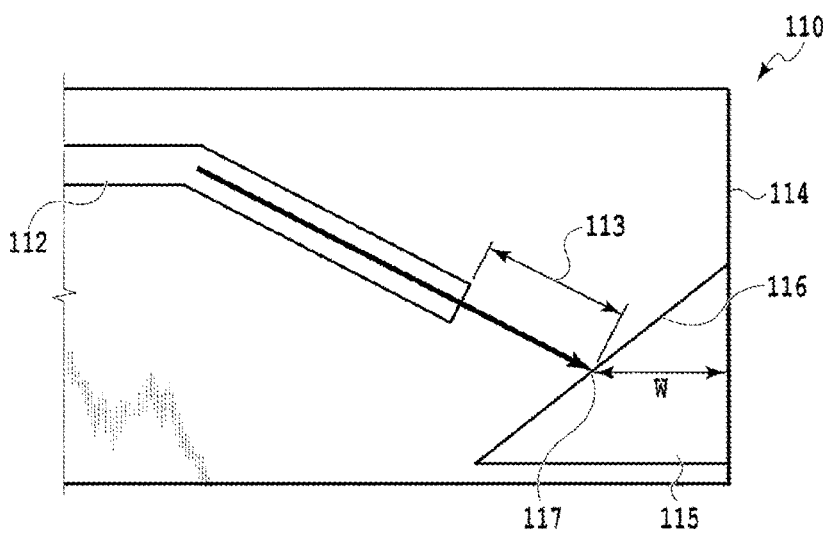
FIG. 11 is a diagram showing the structure of the open groove of the output end portion according to the present embodiment.

By using the above-mentioned etched facet structure, the length of the window region can be made with high accuracy regardless of the error of the cleavage position, and the yield in the window region manufacturing process can be remarkably improved. The positional accuracy in a general cleavage process is approximately ±10 μm. As shown in FIG. 11, the distance between an emission point 117 at which the center of the light beam emitted from the bent waveguide 112 reaches the emission end face 116 and the cleavage plane 114 is defined as an open groove width W. If the open groove width W>10 μm, the length L of the window region 113 is not affected even if misalignment of the cleavage occurs. The window structure can be manufactured with a high yield without affecting various characteristics such as a reflection return light quantity and an emission angle even when a deviation occurs in the cleavage position.

As shown in FIG. 10, the emission angle of outgoing light to the outside of the semiconductor chip can be set to 0° by providing the angle $\theta_f$ of the etched facet. For example, the incidence accuracy of light onto the emission end face in which a sufficient reflection suppression effect can be generally achieved is 7°. In FIG. 10, since $\theta_1 = 7°$, $\theta_2 = 22°$ is obtained from Snell's law. As a result, the bending angle of the waveguide $\theta_{wg} = 15°$ and the etched facet angle $\theta_f = 22°$ are obtained. By using this design value, when observed from the outside of the chip, an optical output can be obtained at an emission angle of 0°. As a result, a small, low-cost optical transmitter that can not only significantly reduce the man-hours for mounting on a subcarrier or the like, but also significantly reduce the occupied area of the semiconductor chip in the subcarrier or the like can be realized.

Example 1

Example 1 describes, as an example, a 1.3 μm band optical transmitter capable of generating a 25 Gbit/s modulated signal, in which the optical output during modulation is increased to 8 dBm or more in order to cope with a high-loss budget system.

Figure 12:
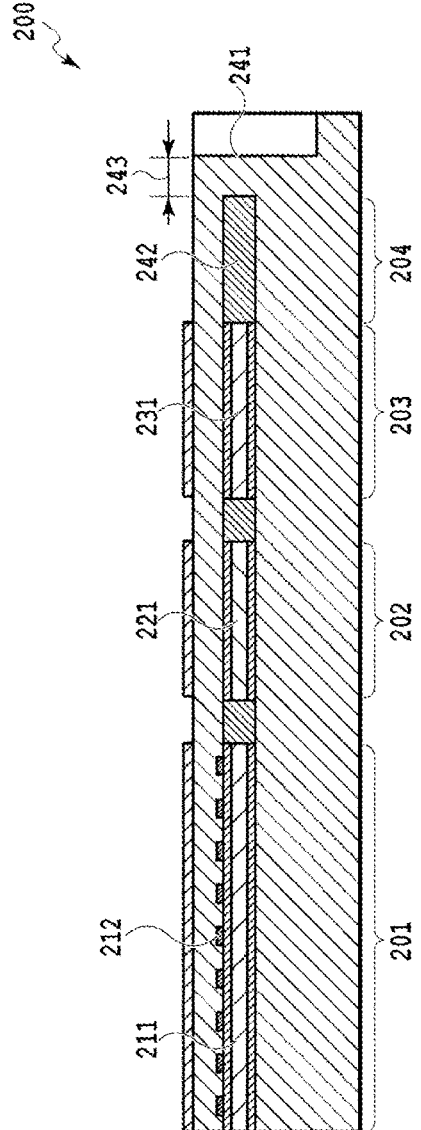
FIG. 12 is a cross-sectional view showing a waveguide structure of an AXEL according to Embodiment 1.

FIG. 12 shows a waveguide structure of AXEL according to Embodiment 1. An AXEL 200 is a monolithic integrated device in which a DFB laser 201 having a length of 300 μm, an EA modulator 202 having a length of 150 μm, and an SOA 203 having a length of 150 μm are integrated in the same substrate. The DFB laser 201 includes an active layer 211 composed of a multiple quantum well (MQW) which generates an optical gain by current injection, and a diffraction grating 212. The EA modulator 202 includes an absorption layer 221 composed of a multiple quantum well (MQW) having a composition different from that of the DFB laser 201. The SOA 203 includes an active layer 231 composed of an MQW structure having the same composition as the DFB laser 201.

An emission end face 241 at an output end portion 204 includes an etched facet formed by dry etching. By adjusting the angle of the etched facet, the light beam that is output from the emission end face 241 through the window region 243 from the waveguide 242 is emitted in a direction perpendicular to the cleavage end face.

Next, a production process of the AXEL 200 will be described. An initial substrate in which a lower SCH (Separated Confinement Heterostructure) layer, an active layer of a multiple quantum well layer (MQW1), and an upper SCH layer are sequentially grown on an n-InP substrate (100), is used. The multiple quantum well layer has an optical gain in an oscillation wavelength of 1.3 μm band. The multiple quantum well is composed of six quantum well layers, and the initial growth substrate including these layers has a structure optimized for high-efficiency operation of the DFB laser.

First, leaving a part that becomes the DFB laser 201 and the SOA 203, other active layers are selectively etched, and a multiple quantum well layer (MQW2) for the EA modulator 202 is grown by butt joint regrowth. Here, the DFB laser 201, the EA modulator 202, and the SOA 203 are arranged so that light propagates in this order. In the SOA 203, the core layer structure formed on the initial growth substrate is left as it is, and the layer structure same as that of the DFB laser 201 is obtained. The difference between the layer structures of these regions is only the presence/absence of the diffraction grating 212. Thus, despite the structure in which a plurality of regions are integrated, the number of regrowth cycles is suppressed, and low-cost manufacturing is made possible.

Next, a boundary part between the DFB laser 201 and the EA modulator 202, a boundary part between the EA modulator 202 and the SOA 203, and the output end portion 204 extending from a terminal end of the SOA modulator 202 to the emission end face are selectively etched again. By performing butt joint regrowth, a bulk semiconductor that becomes a core layer of the output end portion 204 is grown. Subsequently, the diffraction grating 212 that operates in the 1.3 μm wavelength band of oscillation is formed in the DFB laser 201. Here, the resonator of the DFB laser 201 forms a diffraction grating to output light in the direction of the crystallographic orientation [011] or [01-1-] (hereafter "1-" denotes a superscript bar of 1) of the substrate. Subsequently, a p-InP cladding layer and a contact layer are grown again on the entire surface of the device by regrowth. The thickness of the cladding layer is designed so that the light field does not cover the electrode region, and is 2.0 μm in Example 1

Next, a mesa structure of the part that becomes the waveguide is formed by etching. In the window region 243, the part that becomes the terminal end of the waveguide 242 is also produced collectively in the present process.

Figure 13:
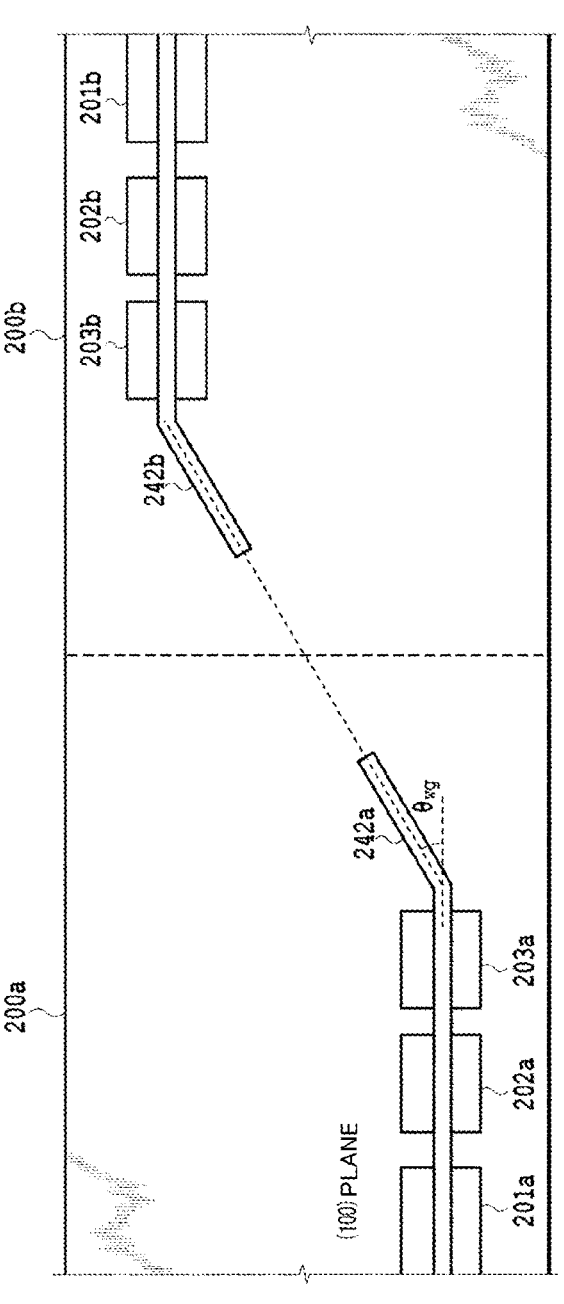
FIG. 13 is a diagram showing a structure of an output end portion of the AXEL according to Example 1.

FIG. 13 shows the structure of the output end portion of the AXEL according to Embodiment 1. The structure of the waveguide viewed from the upper surface of the AXEL 200 is shown. In order to make the arrangement of the chips of the adjacent optical transmitters easy to understand in the wafer state prior to the cleavage process, two adjacent chips before being separated in the cleavage process are shown in FIG. 13.

As described above, the DFB laser 201 is formed so as to allow light to propagate in the direction of the crystallographic orientation [011] (or [01-1-]), and the EA modulator 202 and the SOA 203 are also arranged in the same orientation and on the same optical axis. The wavelength is formed between the SOA 203 and the window region 243 of the output end portion 204. Here, the waveguide 242 reaching the window region 243 is a bent waveguide having an angle of $\theta_{wg}$ with respect to the crystallographic orientation [011] (or [01-1-]), and light after the bent waveguide propagates at the propagation angle described above.

In Example 1, the incident angle $\theta_1$ of light to the etched facet is designed so that $\theta_1 = 5°$ is satisfied. Therefore, since it is assumed that the outgoing angle $\theta_2$ from the etched facet is approximately 16°, the bending angle $\theta_{wg}$ of the waveguide is set at 11°.

Next, semi-insulating InP layers doped with Fe are formed on both sides of the mesa by burying regrowth. By this process, bulk InP is also grown in the window region. Subsequently, in order to electrically isolate the respective regions of the DFB laser 201, the EA modulator 202, and the SOA 203, the contact layers between the respective regions are removed by wet etching. Subsequently, a P-side electrode for injecting current through the contact layer on each region of the upper surface of the semiconductor substrate is formed.

Next, an open groove (described later) is formed by a dry etching process, thereby forming an emission end face (etched facet) for outputting light from the AXEL 200. Thereafter, the InP substrate is polished to approximately 150 μm, and an electrode is formed on the rear surface of the substrate, completing the process on the semiconductor wafer. Next, a semiconductor bar including a plurality of AXEL chips is produced by forming a crystal (011) plane by cleavage. Here, a cleavage process for a typical semiconductor chip is used, wherein the cleavage position accuracy is ±10 μm or less. In the semiconductor bar in which a plurality of optical transmitter chips produced by a cleavage process are connected, AR coating is applied to an end face on the front side where S light is output, and high reflection coating HR is applied to an end face on the opposite side.

Figure 14:
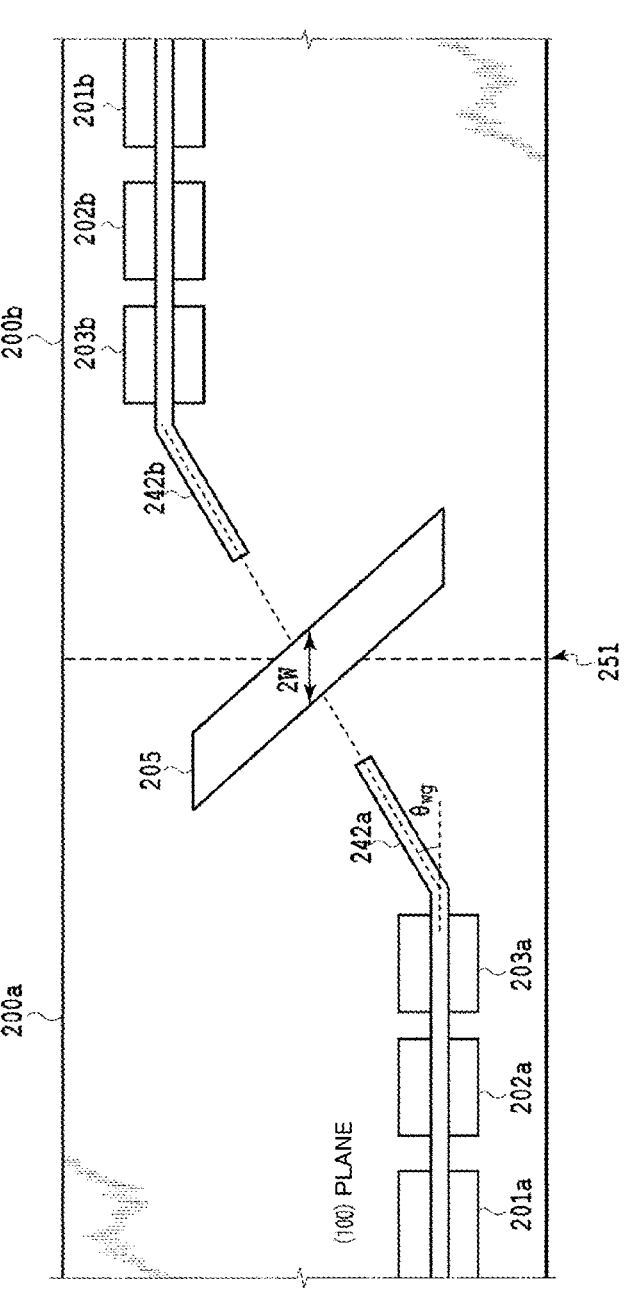
FIG. 14 is a diagram showing a structure of an open groove of the AXEL according to Example 1.

FIG. 14 shows the structure of the open groove of the AXEL according to Example 1. An open groove 205 is formed so as to extend over a cleavage position 251. As described above, the surface formed by cleavage is a crystal plane (011). Here, the open groove 205 has a parallelogram shape. The length parallel to the crystallographic orientation [011] is defined as 2W. Therefore, the light is separated from the cleavage position 251 to the emission point on the etched facet where the light is emitted, by the width W. In order to compensate for manufacturing errors in the cleavage process, the width W needs to be equal to or larger than the cleavage accuracy. This time, the cleavage position is produced with W=10 μm in consideration of that the general cleavage position accuracy is ±10 μm or less.

Figure 15A:
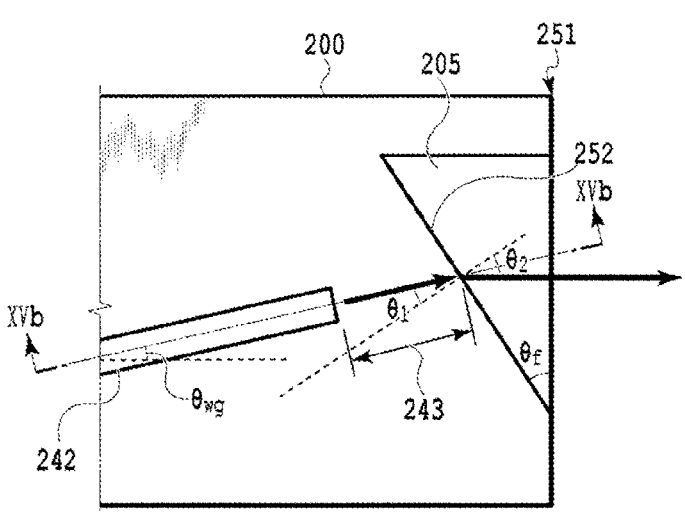
FIG. 15A is a diagram showing the structure of the open groove of the output end portion according to Example 1.
Figure 15B:
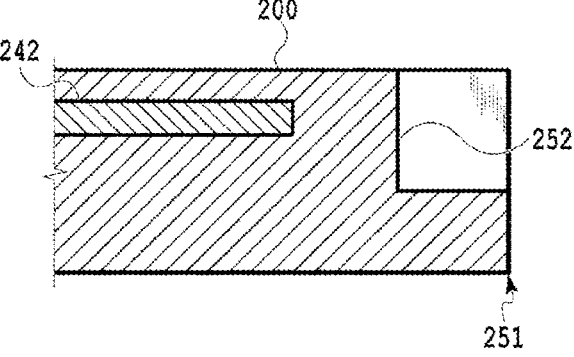
FIG. 15B is a cross-sectional view showing the structure of the open groove of the output end portion according to Example 1.

FIG. 15A shows the structure of the open groove of the output end portion according to Example 1. In FIG. 15B, an etched facet 252 is formed in which, of the sides forming the open groove 205, the side that intersects with the center of the light beam emitted from the waveguide 242 becomes an emission end face. The surface of the etched facet 252 is designed to form the angle $\theta_f$ with respect to the crystal plane (011) formed by cleavage. As described above, in Example 1, the incident angle $\theta_1$ to the etched facet 252 is set to 5°. Therefore, the etched facet 252 is designed so that the angle $\theta_f$ formed by the etched facet is 16°. The light emitted from the waveguide having the angle $\theta_{wg}$=11° with respect to the crystallographic orientation [011] enters the etched facet at the angle $\theta_1$=5°, and is emitted at the emission angle $\theta_2$=16°. As a result, this outgoing light is emitted in the same direction as the crystallographic orientation [011], and is emitted in the direction perpendicular to the cleavage plane (011).

Figure 16:
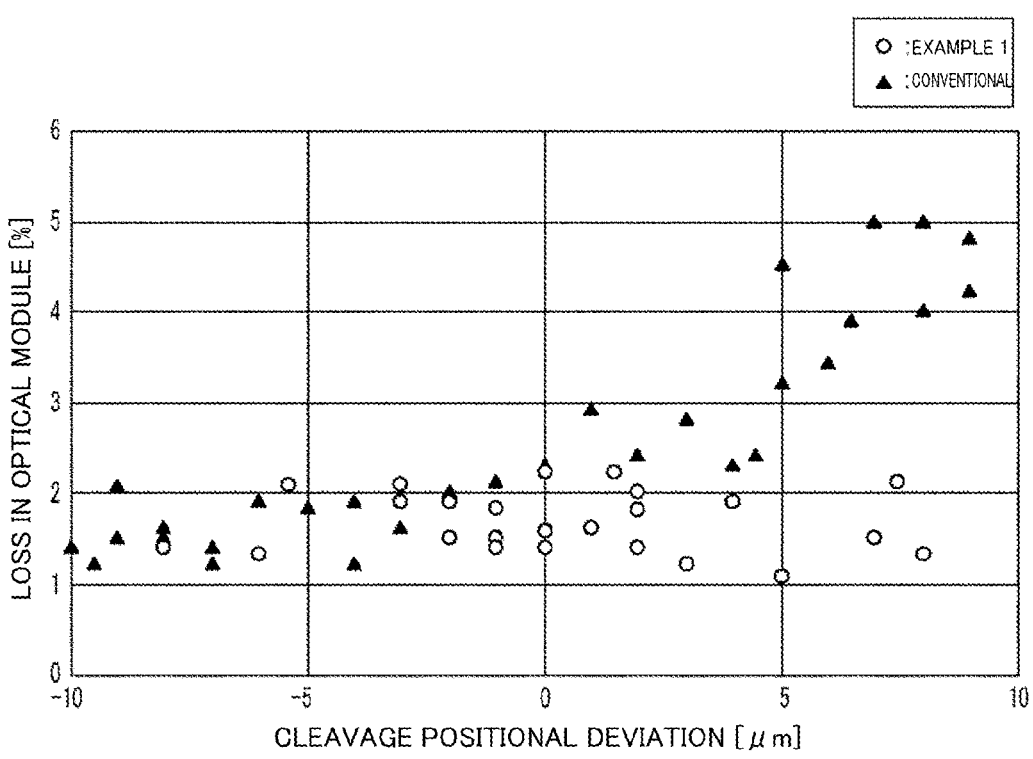
FIG. 16 is a diagram showing a relationship between a variation in length of a window region of the AXEL according to Example 1 and optical loss.

FIG. 16 shows a relationship between a variation in length of the window region of the AXEL according to Example 1 and optical loss. In order to confirm the effect of the introduction of the etched facet, an optical transmitter was produced using a plurality of AXEL chips produced in the same process, and the loss within the optical transmitter was evaluated. In this case, the optical output by CW driving was measured in advance for the AXEL chips having completed the cleavage process, and the amount of deviation of the cleavage position was evaluated as an actual measurement value. The condition of CW driving is that the EA modulator 202 was in a non-biased state, and the optical output was measured when a current of 80 mA is applied to the DFB laser 201 and a current of 40 mA is applied to the SOA 203. The operating temperature for the AXEL chips was 55° C.

Next, each AXEL chip was mounted on a butterfly type package by a general active mounting process, to produce an optical transmitter. An optical fiber was coupled to the produced optical transmitter, and the optical output was evaluated under the same conditions as the above-described measurement, and optical coupling losses before and after mounting on the optical transmitter were compared. FIG. 16 also shows the evaluation result of the optical transmitter according to Example 1 and the evaluation result of the optical transmitter having a conventional window structure. In this case, the horizontal axis represents the amount of positional deviation at the time of cleavage, and the vertical axis represents optical losses inside the optical transmitter.

Figure 7:
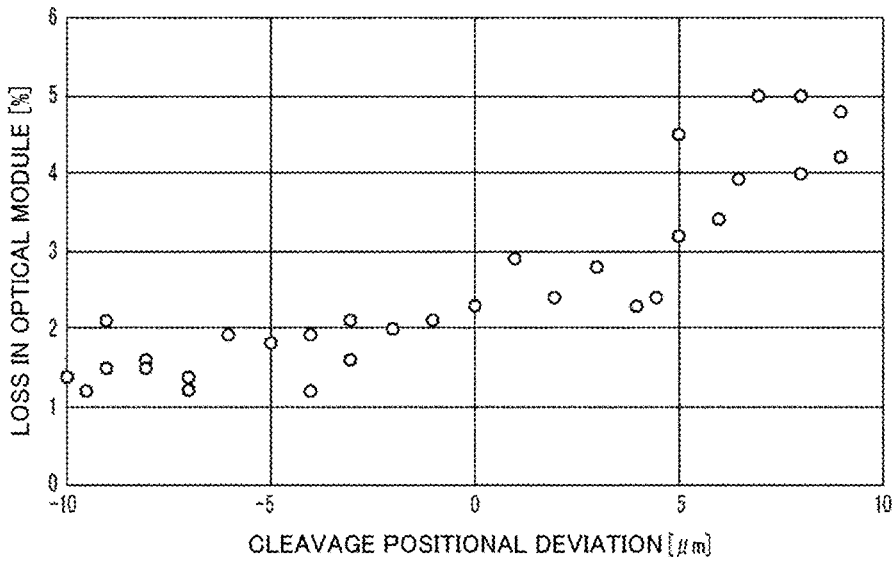
FIG. 7 is a diagram showing a relationship between variation in lengths of window regions of the plurality of conventional AXELs and optical loss.
Figure 8:
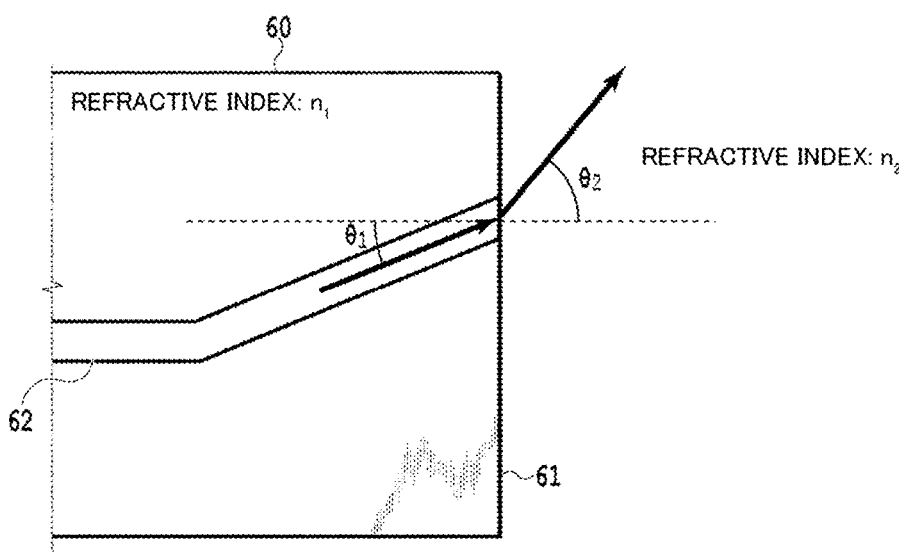
FIG. 8 is a diagram schematically showing a propagation direction of light at an emission end face in a semiconductor chip having a bent waveguide.

The conventional example shows the same data as FIG. 7, and is indicated by Δ. As described above, there is a limit in the positional accuracy of the cleavage, and as shown in FIG. 16, a certain degree of variation occurs. In a general manufacturing process of a window structure, the length of the window region is determined by the cleavage position. In this method, the optical coupling loss of the module greatly varies depending on the deviation of the cleavage position, and when the length of the window region becomes larger than the design value, the optical loss increases significantly. The net optical output of a conventional AXEL chip is estimated to be approximately 10 dBm on average in the output at the time of modulation. Therefore, if the loss increases by 2 dB or more when mounted in the optical transmitter, an optical transmitter that does not meet the target +8 dBm optical output is produced, and this is a major factor that reduces the yield during the manufacturing of the optical transmitter.

The evaluation result of the optical transmitter according to Example 1 is indicated by ○. In the AXEL chip equipped with the etched facet, no correlation is observed between the amount of deviation of the cleavage position and the optical loss at the time of manufacturing, and a stable optical coupling loss is obtained even against the positional deviation of the cleavage. From this result, by introducing the etched facet, it is possible to manufacture, with a high yield, an AXEL chip having a window structure in which variation in optical loss is inevitable in the past. The yield of the AXEL chip in the wafer was approximately 40% in the conventional manufacturing method with respect to the target value of the optical output at the time of modulation of 8 dBm or more. However, in the AXEL chip according to Example 1, the manufacturing yield can be improved significantly up to approximately 75%.

Using the optical transmitter having the AXEL chip of Example 1 mounted thereon, the characteristics at 25 Gbit/s modulation were evaluated to confirm the operation quality. As modulated signals, NRZ and PRBS $2^{31}$-1 were used. Here, in all the AXEL chips, the current value of the DFB laser 201 was set to 80 mA, and the voltage applied to the EA modulator 202 was set to −1.5 V, to perform comparison. The drive current of the SOA 203 was set to 70 mA. Here, from the EYE waveform evaluation of 25 Gbit/s, a dynamic extinction ratio of 9.1 dB was obtained.

Figure 3:
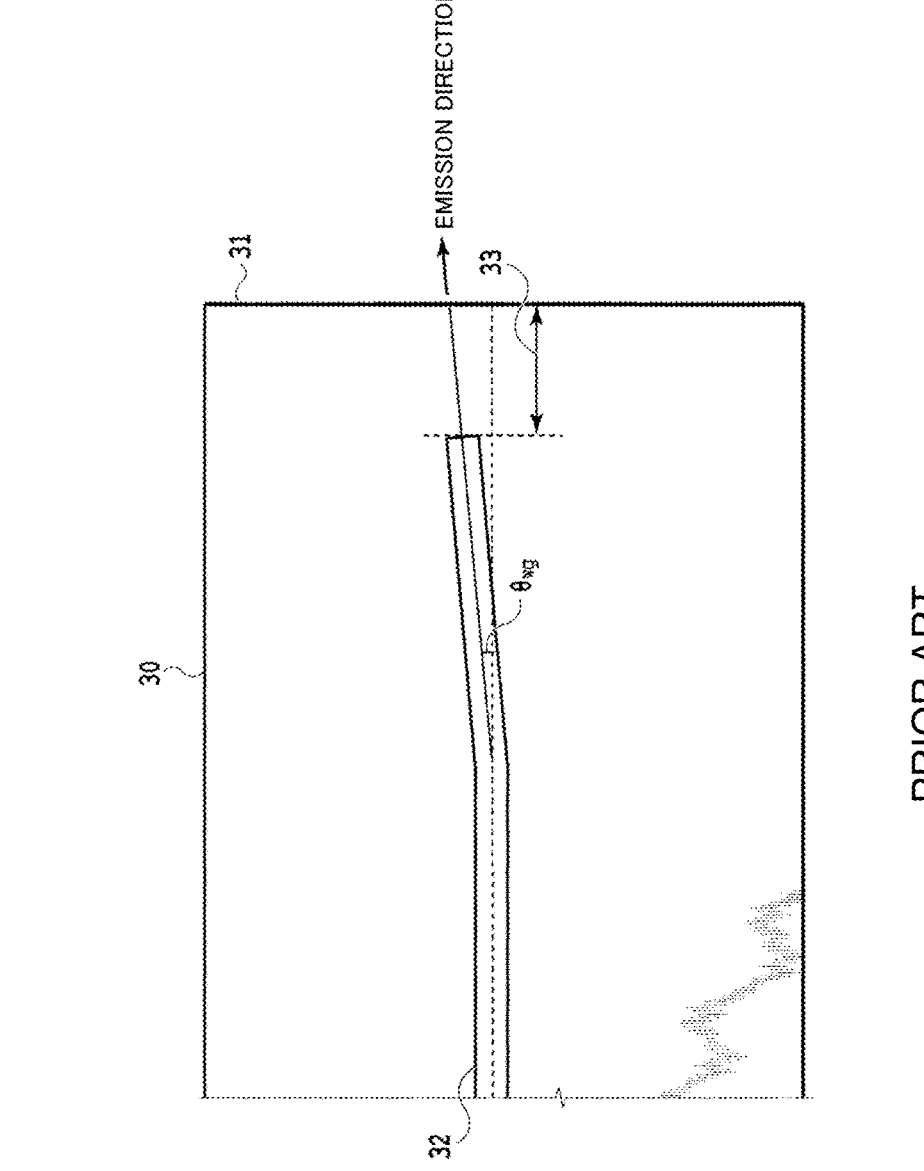
FIG. 3 shows a structure of an output end portion in a conventional AXEL.
Figure 5:
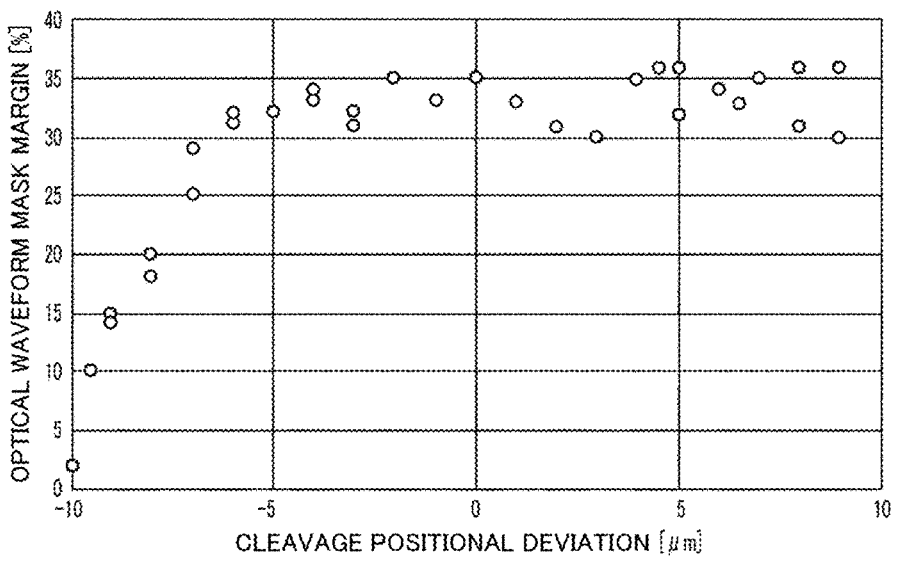
FIG. 5 shows the results of evaluating the optical waveform quality of a plurality of conventional AXELs.
Figure 6:
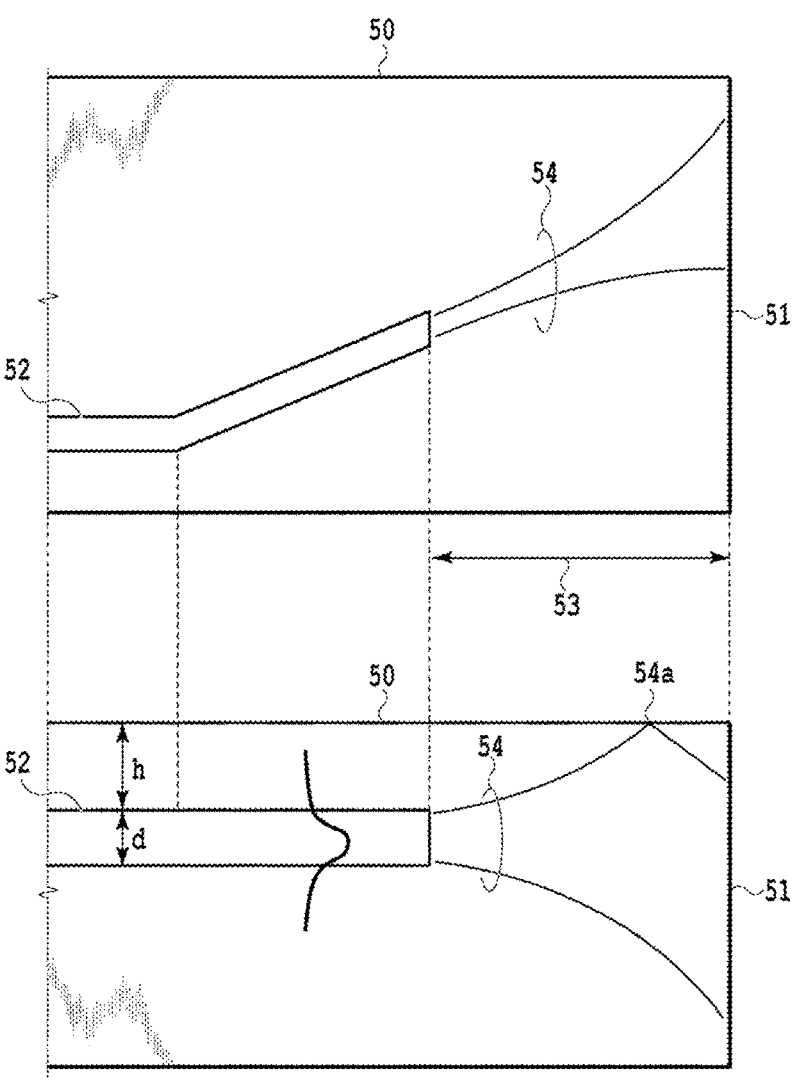
FIG. 6 is a diagram showing the shape of a light beam by the window structure formed at the output end portion.
Figure 17:
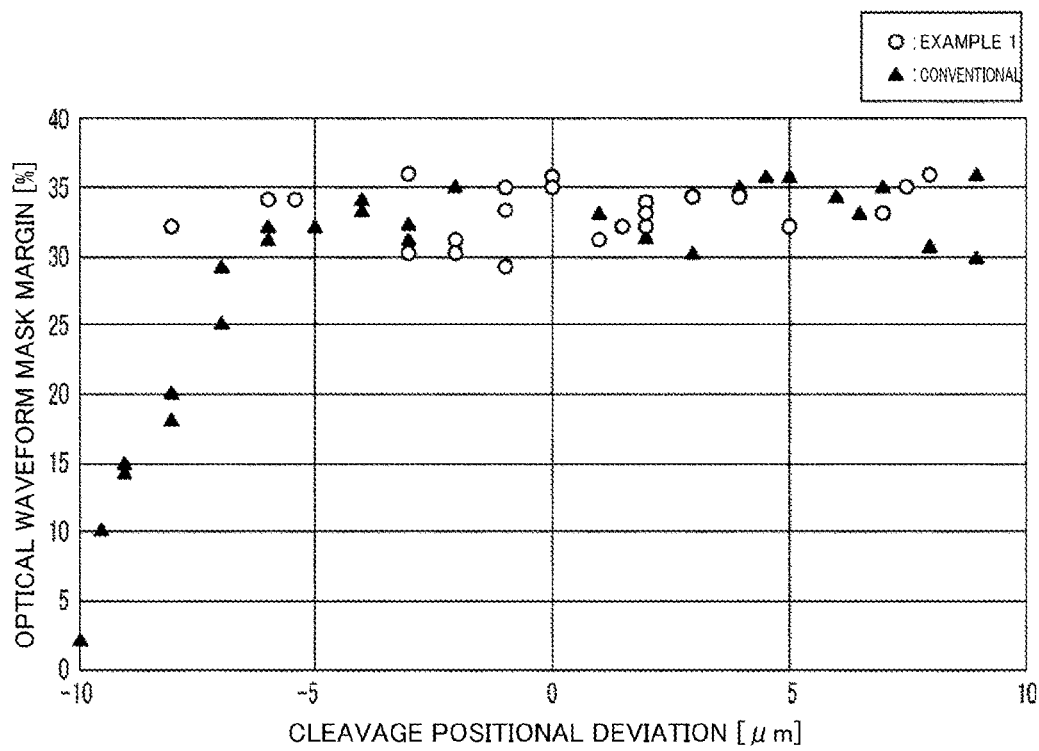
FIG. 17 is a diagram showing the results of evaluating the optical waveform quality of the AXEL according to Example 1.

FIG. 17 shows the result of evaluation of the optical waveform quality of the AXEL according to Example 1. As in FIG. 5, the vertical axis represents an index called a mask margin representing the quality of the optical waveform, and represents an aperture of the eye which is more clear as the margin gets larger. The conventional example shows the same data as FIG. 5, and is indicated by Δ. As indicated by ○ on the evaluation result of the optical transmitter according to Example 1, a stable mask margin>30% is obtained regardless of the deviation of the cleavage position. This is the same level as that of an optical transmitter in which the conventional AXEL chip of good quality was obtained. Therefore, there is no deterioration in the waveform quality of the optical signal according to Example 1, and only the manufacturing yield is dramatically increased. When the transmission characteristic at 40 km were evaluated with a single mode fiber by using the operating conditions described above, error-free transmission below a bit error rate or $10^{-12}$ was confirmed. From the above results, by introducing the window structure having the etched facet to the AXEL chip having a window structure, the manufacturing yield can be remarkably improved without deteriorating the performance of the conventional optical transmitter.

Example 2

Figure 18A:
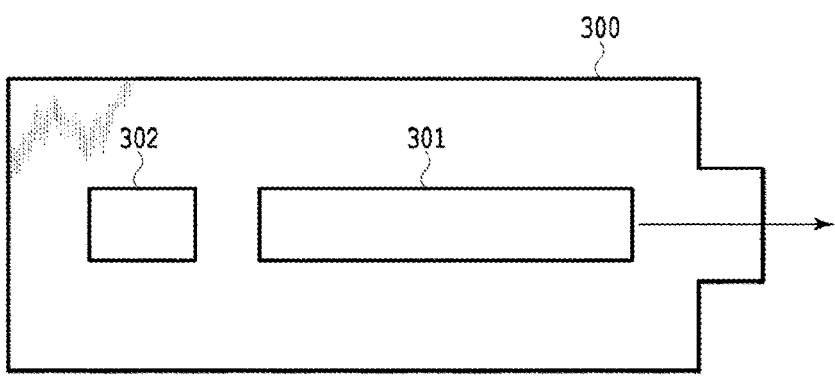
FIG. 18A is a diagram for explaining miniaturization of an optical module on which an AXEL chip is mounted.
Figure 18B:
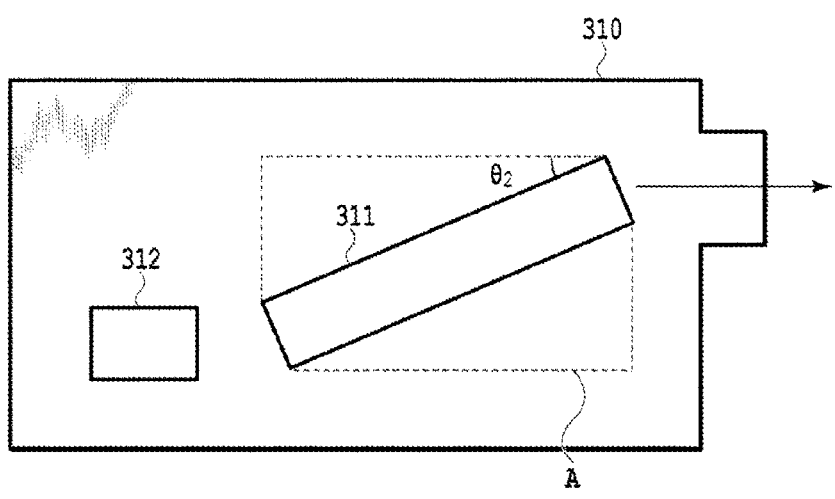
FIG. 18B is a diagram for explaining the miniaturization of the optical module on which the AXEL chip is mounted.

The miniaturization of the optical transmitter on which an AXEL chip is mounted will be described with reference to FIGS. 18A and 18B. FIG. 18A shows an optical transmitter 300 in which an AXEL chip 301 having a linear waveguide applied to an output end portion, and a semiconductor chip 302 such as a control circuit are mounted on a butterfly type package. FIG. 18B shows an optical transmitter 310 in which an AXEL chip 311 having a bent waveguide applied to an output end portion, and a semiconductor chip 312 such as a control circuit are mounted on a butterfly type package. In the optical transmitter 310, it is necessary to arrange the optical transmitter 310 obliquely in the butterfly type package due to the influence of the emission angle from the AXEL chip 311, and consequently a chip dedicated area A increases. Therefore, the optical transmitter 310 requires a butterfly type package larger than the optical transmitter 300, making it difficult to miniaturize the optical transmitter 310.

On the other hand, by applying the AXEL chip of Example 1 shown in FIG. 15, the outgoing light is emitted in the same direction as the crystallographic orientation [011], and is emitted in a direction perpendicular to the cleavage plane (011). Therefore, the butterfly type package shown in FIG. 18A can be applied. The butterfly type package has been described as an example, but the same effect can be achieved in various packages constituting an optical module.

Since the AXEL chip is a device in which regions having a plurality of functions are integrated, the length of the chip in the light propagation direction is relatively long. Further, SOA having a long optical path length is required to increase the output of the optical output, resulting in a longer AXEL chip. A typical AXEL chip has a length of 1250 μm and a width of 250 μm, and when the angle of a bent waveguide for suppressing end face reflection is set at 7°, the emission angle $\theta_2$ becomes 22°. Therefore, the AXEL chip 311 needs to be disposed at $\theta_2=22°$ with respect to the emission direction of the butterfly type package. In this case, the dedicated area A of the AXEL chip 311 is increased by approximately four times compared with the AXEL chip 301.

Figure 19:
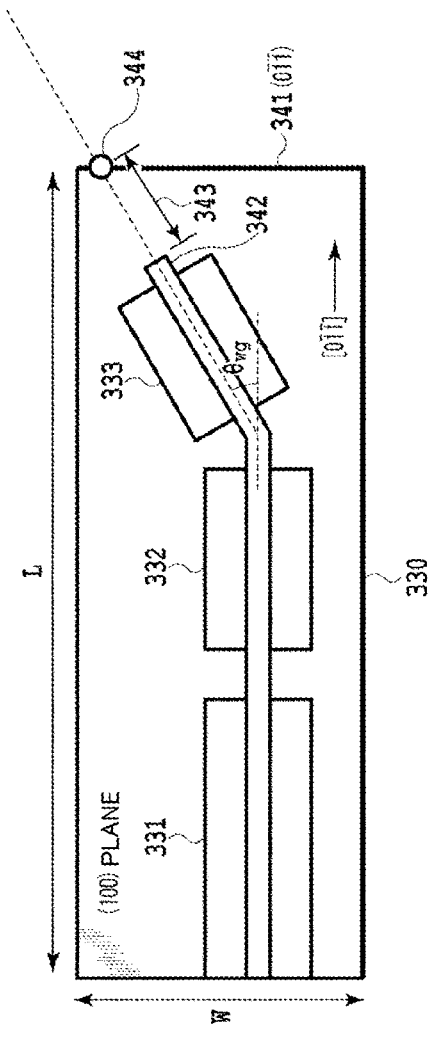
FIG. 19 is a diagram for explaining miniaturization of the AXEL chip.

FIG. 19 also shows miniaturization of an AXEL chip. As described above, it is difficult to reduce the size of the chip in the direction of the optical axis in order to achieve high output of the AXEL. It is also difficult to reduce the chip width orthogonal to the optical axis. An AXEL chip 330 is a monolithic integrated device having a total length of 1250 μm, in which a DFB laser 331 having a length of 300 μm, an EA modulator 332 having a length of 150 μm, and an SOA 333 having a length of 150 μm are integrated.

When a bent waveguide 342 is introduced into the AXEL chip 330, a beam emission position 344 at which light emitted from the waveguide reaches a cleavage plane 341 is shifted from the center of the cleavage plane 341. That is, if the width W of the AXEL chip 330 is reduced too much, the light beam emission position approaches an end of the cleavage plane 341. In addition, if the light beam is designed so that the emission position thereof is located at the end of an end face, due to the large deviation error in the position in the cleavage process as described above, there is a risk that the emission position is shifted from the cleavage plane and reaches a side wall. For this reason, in the past, the width of the AXEL chip is made large enough to compensate for the errors of the cleavage position, and the width W=approximately 250 μm was required. According to Example 1, the introduction of the etched facet can prevent the positional deviation of the emission position caused by a manufacturing error of the cleavage process, and therefore the width of the AXEL chip can be reduced.

Figure 20:
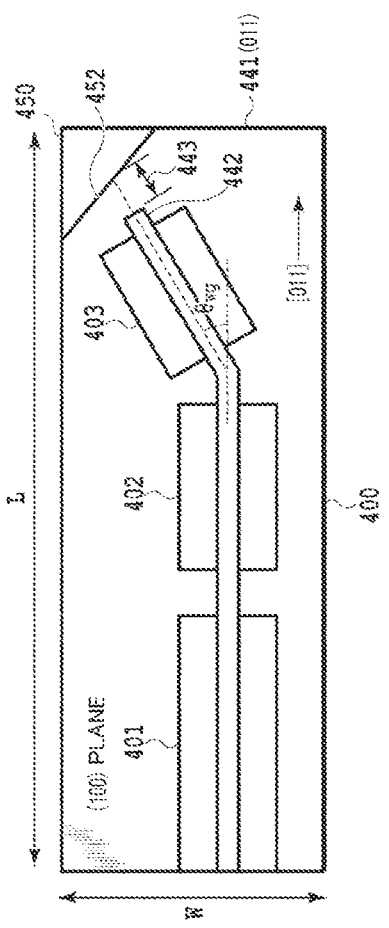
FIG. 20 is a diagram showing a structure of an AXEL chip according to Example 2.

FIG. 20 shows the structure of an AXEL chip according to Example 2, in which, as with the AXEL chip according to Example 1, an AXEL 400 is produced on an InP substrate (100) surface, a DFB laser 401 and an EA modulator 402 each includes an optical axis in the direction of the crystallographic orientation [011]. In Example 2, the incident angle $\theta_1$ with respect to the emission end face of the chip was set at 7° in order to obtain a sufficient reflection suppressing effect on the end face of the chip together with high optical output characteristics. Therefore, in order to provide an etched facet 452 and an emission angle of 0° from the chip, a bent waveguide 442 having $\theta_{wg}=15°$ with respect to the crystallographic orientation [011] was used. Also, in Example 2, an SOA 403 is disposed behind the bent waveguide 442 in order to compensate for the optical loss in the bent waveguide 442. A window region 443 is disposed behind the SOA 403, and the emission direction of light is converted in parallel with the crystallographic orientation [001] by an etched facet 452, and then output to the outside of the chip.

An AXEL chip 400 is a monolithic integrated device in which the 300 μm-long DFB laser 401 having an oscillation wavelength of 1.3 μm, the EA modulator 402 having a length of 150 μm, and the SOA 403 are integrated. The length of the SOA 403 is 200 μm, and is set to longest in order to achieve both the optical waveform quality and high output characteristics at the time of 25 Gbit/s modulation. The total length L in the direction [011] of the AXEL chip 400 is 1250 μm.

Figure 21A:
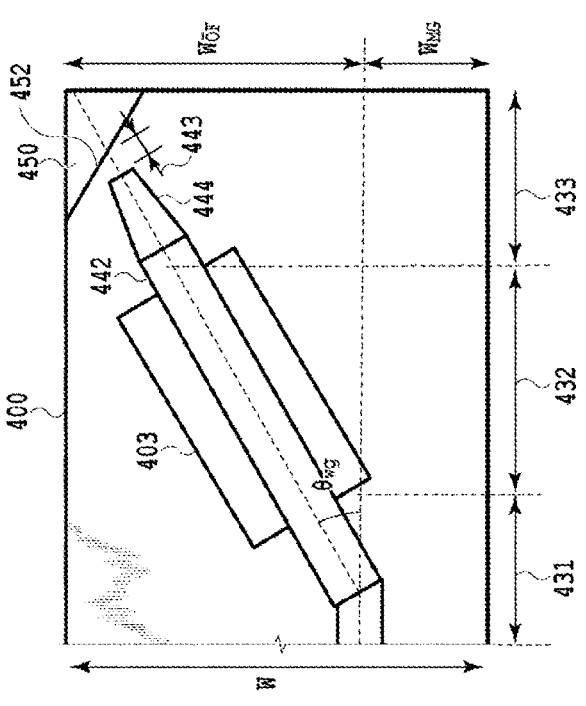
FIG. 21A is a diagram showing a structure of an output end portion of the AXEL according to Example 2.

FIG. 21A shows the structure of the output end portion of the AXEL according to Example 2. Here, the bent waveguide 442 and the SOA 403 are divided into a bent region 431, an SOA region 432, and an emission region 433, with respect to the crystallographic orientation [011]. The minimum length of the bent region 431 required for bending the waveguide at an angle $\theta_{wg}=15°$ was 150 μm. The length of the SOA region 432 is equal to the length obtained by multiplying the SOA 403 by cos $\theta_{wg}$. The length of the emission region 433 including the window region 443 is 100 μm. Therefore, the maximum length required for the crystallographic orientation [011] after the bent waveguide in the AXEL chip is 450 μm. Note that, a tapered structure 444 in which the width of the waveguide becomes gradually narrowed is used at the emission end portion of the bent waveguide 442 (see PTL 1, for example).

In this case, an offset $W_{OF}$ of the optical axis with respect to a crystallographic orientation [01-1] is approximately 120 μm (450 μm×tan $\theta_{wg}$), and this value is a limiting value of the width W of the AXEL chip 400. In Example 2, a margin $W_{MG}$ from the bent waveguide 442 to the side wall of the chip is 30 μm, and the width of the AXEL chip 400 is 150 μm. The light emission position in the vicinity of the intersection between the (011) plane of a cleavage end face 441 and the (01-1) plane of the chip side wall. According to this configuration, since the positional deviation of the emission position caused by a manufacturing error of the cleavage process can be prevented by introducing the etched facet, the width of the AXEL chip 400 can be reduced significantly as compared with the width W=250 μm of the AXEL chip 330 shown in FIG. 19.

Figure 21B:
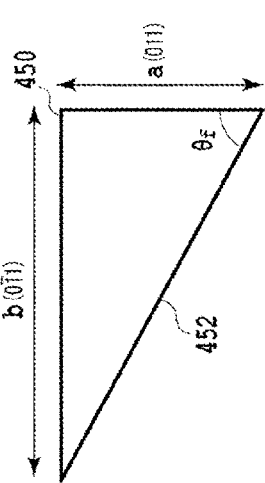
FIG. 21B is a diagram showing a structure of an open groove of the AXEL according to Example 2.

FIG. 21B shows the structure of the open groove of the AXEL according to Example 2. An open groove 450 for forming the etched facet 452 is disposed so as to extend over the (011) plane formed by cleavage and the (01-1) plane of the chip side wall. In a single AXEL chip, the open groove 450 is formed in a right triangle in which the oblique side thereof is the side where the etched facet 452 is formed. When the sides parallel to the (011) plane and the (01-1) plane are defined as a and b, the angle formed by the oblique side and the side a is defined as $\theta_f$. In Example 2, by setting $\theta_f=22°$, light can be extracted by setting the emission angle from the AXEL chip 400 to 0°. In order to compensate for the positional deviation errors between the (011) plane and the (01-1) plane, the length of each side needs to be equal to or greater than the cleavage accuracy. In Example 2, the length of the side a is 25 μm, and the length of the side b is 10.1 μm. Therefore, the length of the oblique side constituting the etched facet 452 is 27 μm.

Figure 22:
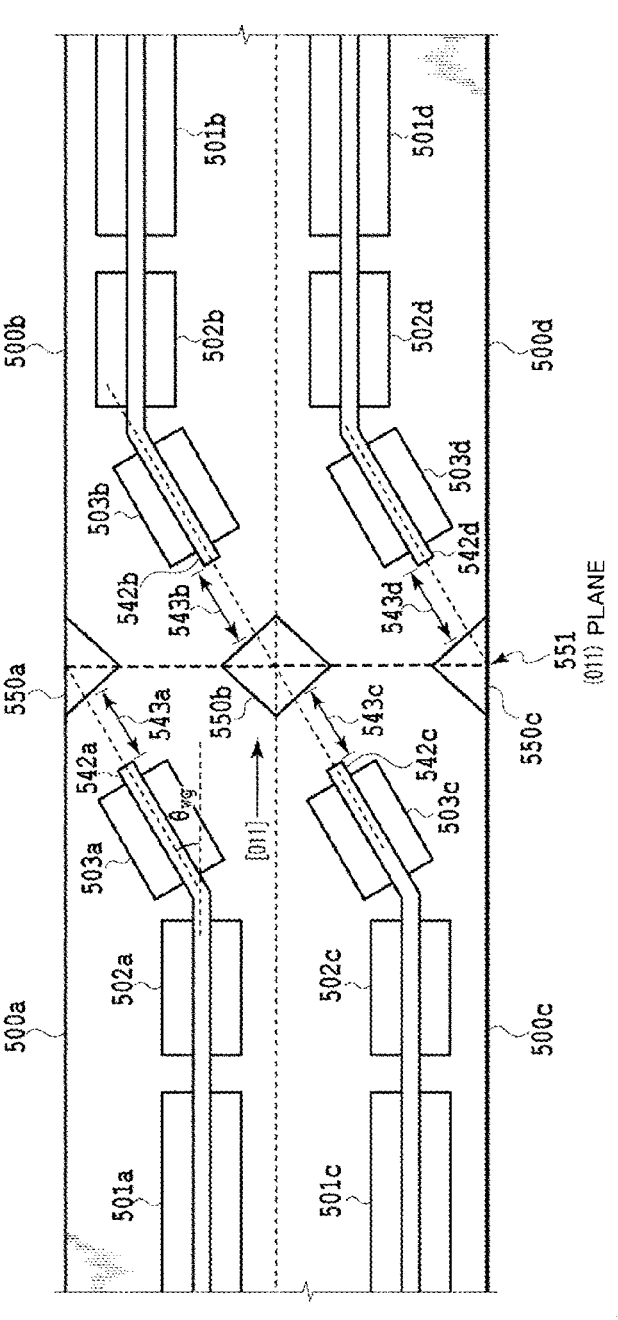
FIG. 22 is a schematic view showing a case where a window structure of the AXEL according to Example 2 is produced by cleavage.

FIG. 22 is a schematic view showing a case where the window structure of the AXEL according to Example 2 is produced by cleavage. An open groove 550 is formed in four adjacent AXEL chips 500*a* to 500*d* so as to extend over a cleavage position 551. As described above, the surface formed by cleavage is a crystal plane (011). The open groove 550 has a diamond shape with the length of each side being 27 μm, where two opposite sides form an etched facet on two AXEL chips 500*b* and 500*c*. The internal angle of the diamond is 44° and 136°, and the lengths of two diagonal lines are equal to 2a and 2b, that is, 50 μm and 20 μm respectively, from the sides a and b shown in FIG. 21B.

On an actual wafer, with four AXEL chips as the basic building blocks, 8×66 chips are arranged in a 1 cm square to form a group, and a plurality of chip groups are further produced.

Hereinafter, the cleavage process will be described. After the group of chips described above (8×66 chips) are cut out from the wafer, eight bars including 66 chips are produced by cleavage of the (011) plane. After AR, HR coating is applied to the (011) plane and the (01-1-) plane of each bar, cleavage is performed on the (01-1) plane of each bar, to cut the bar into a single AXEL chip. As a result of checking the positional accuracy in the two cleavage processes, it was confirmed that the positional error was ±10 μm or less all cleavage processes. As a result of confirming the chip emission angle of the produced AXEL chip, it was confirmed that the emission angle of ±0.01° or less was accomplished in all of the chips with respect to the (011) plane of the cleavage end face 551.

As described above, an AXEL chip having a chip width of 150 μm and an emission angle of 0° is realized with a high yield. The conventional AXEL chip has an emission angle of 22° and a chip width of 250 μm at most. On the other hand, in the AXEL chip of this example, the chip size is reduced by approximately 40%, and the emission angle is set to 0°, so that the chip dedicated area when the chip is mounted as an optical transmitter can be reduced by 75%.

The basic characteristics of the produced AXEL chip were evaluated. At an operating temperature of 55° C., a current of 80 mA was applied to the DFB laser and a current of 100 mA was applied to the SOA. The EA modulator was modulated by a 25 Gbit/sNRZ signal at an applied voltage of −1.5 V and an amplitude voltage of Vpp=1.5 V, whereby high output characteristics reaching an optical output at modulation of 11 dBm were confirmed. When the yield of the optical transmitter produced by the AXEL chip was evaluated, a very good result of approximately 60% was confirmed in the AXEL chip having the etched facet according to Example 2, with respect to the target optical output at modulation of 10 dBm or more.

The invention claimed is:

1. A semiconductor chip comprising:
a waveguide having a terminated face at an output end portion from which light is emitted, the terminated face being located at an internal position inside of the semiconductor chip spaced apart from an emission end face;
a window region made of a bulk semiconductor and disposed between the terminated face of the waveguide and the emission end face;
an open groove formed in the output end portion, the emission end face being a side wall of the open groove formed by etching; and a cleavage plane provided in the open groove and onto which the light emitted from the emission end face is incident,
wherein
the terminated face of the waveguide is an end face that emits the light to the window region in a direction along a perpendicular line of the terminated face,
a terminated face of the window region forming the emission end face has a perpendicular line in a direction different from a perpendicular line of the cleavage plane, the light that has propagated through the window region is incident onto the terminated face of the window region at an incident angle shifted from the perpendicular line of the terminated face of the window region, and the light incident at the incident angle is refracted and emitted in the direction along the perpendicular line of the cleavage plane.

2. The semiconductor chip according to claim 1, wherein a length L of the window region extending from a terminal end of the waveguide to the emission end face is 5 μm<L<15 μm.

3. The semiconductor chip according to claim 1, wherein the waveguide is a bent waveguide forming an angle of $\theta_{wg}$ with respect to the perpendicular line of the cleavage plane, and when an angle formed between the emission end face and the cleavage plane is defined as $\theta_f$, an incident angle of light with respect to the emission end face is defined as $\theta_1$ and the light is refracted at the emission end face and emitted to the open groove at an emission angle $\theta_2$, $\theta_{wg}=\theta_2-\theta_1$ and $\theta_f=\theta_2$ is satisfied.

4. The semiconductor chip according to claim 3, wherein the incident angle $\theta_1$ of light with respect to the emission end face is 4°<$\theta_1$<8°.

5. The semiconductor chip according to claim 1, further comprising:
a DFB laser having an active layer composed of a multiple quantum well that generates an optical gain by current injection, and a diffraction grating;
an EA modulator having an absorption layer composed of a multiple quantum well having a composition different from that of the DFB laser; and
a semiconductor optical amplifier having an active region with the same composition as the DFB laser and connected to the waveguide of the output end portion,
wherein the DFB laser, the EA modulator, and the semiconductor optical amplifier are monolithically integrated on a same substrate.

6. The semiconductor chip according to claim 5, wherein the DFB laser, the EA modulator, and the semiconductor optical amplifier are formed on a (100) plane of an InP substrate, and an optical axis of the DFB laser is a direction of a crystallographic orientation [011] or [01-1-] of the substrate.

7. An optical module, comprising:
a semiconductor chip mounted in a package and including:
a waveguide having a terminated face at an output end portion from which light is emitted, the terminated face being located at an internal position inside of the semiconductor chip spaced apart from an emission end face;
a window region made of a bulk semiconductor and disposed between the terminated face of the waveguide and the emission end face;

an open groove formed in the output end portion, the emission end face being a side wall of the open groove formed by etching; and a cleavage plane provided in the open groove and onto which the light emitted from the emission end face is incident, wherein the terminated face of the waveguide is an end face that emits the light to the window region in a direction along a perpendicular line of the terminated face, a terminated face of the window region forming the emission end face has a perpendicular line in a direction different from a perpendicular line of the cleavage plane, the light that has propagated through the window region is incident onto the terminated face of the window region at an incident angle shifted from the perpendicular line of the terminated face of the window region, and the light incident at the incident angle is refracted and emitted in the direction along the perpendicular line of the cleavage plane, and wherein the waveguide is a bent waveguide forming an angle of $\theta_{wg}$ with respect to the perpendicular line of the cleavage plane, and when an angle formed between the emission end face and the cleavage plane is defined as $\theta_f$, an incident angle of light with respect to the emission end face is defined as $\theta_1$ and the light is refracted at the emission end face and emitted to the open groove at an emission angle $\theta_2$, $\theta_{wg}=\theta_2-\theta_1$ and $\theta_f=\theta_2$ is satisfied.

8. The optical module according to claim 7, wherein the incident angle $\theta_1$ of light with respect to the emission end face is $4°<\theta_1<8°$.

* * * * *